(12) United States Patent
Santou

(10) Patent No.: US 8,291,307 B2
(45) Date of Patent: Oct. 16, 2012

(54) PARITY GENERATOR, PRIORITY ENCODER, AND INFORMATION PROCESSOR

(75) Inventor: Moriyuki Santou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 993 days.

(21) Appl. No.: 12/181,521

(22) Filed: Jul. 29, 2008

(65) Prior Publication Data

US 2008/0282135 A1 Nov. 13, 2008

Related U.S. Application Data

(63) Continuation of application No. PCT/JP2006/301692, filed on Feb. 1, 2006.

(51) Int. Cl.
*G06F 11/00* (2006.01)

(52) U.S. Cl. .................................. 714/801; 714/803

(58) Field of Classification Search .............. 714/801
See application file for complete search history.

(56) References Cited

U.S. PATENT DOCUMENTS

| | | | | |
|---|---|---|---|---|
| 4,035,626 | A * | 7/1977 | Christensen | 708/531 |
| 4,284,890 | A | 8/1981 | Thompson | |
| 4,414,669 | A * | 11/1983 | Heckelman et al. | 714/800 |
| 4,785,393 | A * | 11/1988 | Chu et al. | 712/221 |
| 4,924,421 | A * | 5/1990 | Seguchi | 708/211 |
| 5,438,577 | A * | 8/1995 | Nakase et al. | 714/785 |
| 5,689,451 | A * | 11/1997 | Delamotte et al. | 708/531 |
| 7,231,582 | B2 * | 6/2007 | Worley | 714/773 |
| 2002/0129314 | A1 * | 9/2002 | Kim et al. | 714/755 |
| 2004/0068687 | A1 * | 4/2004 | Kim et al. | 714/755 |
| 2008/0126908 | A1 * | 5/2008 | Lin | 714/758 |
| 2009/0161467 | A1 * | 6/2009 | Lin et al. | 365/222 |
| 2010/0138618 | A1 * | 6/2010 | Leeland | 711/158 |

FOREIGN PATENT DOCUMENTS

| | | |
|---|---|---|
| JP | 1-184547 | 7/1989 |
| JP | 7-200331 | 8/1995 |
| JP | 8-30436 | 2/1996 |
| JP | 2000-20332 | 1/2000 |
| JP | 2000-259392 | 9/2000 |
| JP | 2001-147827 | 5/2001 |
| JP | 2003-274398 | 9/2003 |
| JP | 2005-216400 | 8/2005 |

OTHER PUBLICATIONS

International Search Report mailed Apr. 25, 2006 for corresponding International Application No. PCT/JP2006/301692.
European Patent Office Communication mailed May 18, 2011 for corresponding European Patent Application No. 06712835.5.
Japanese Patent Office Notice of Rejection mailed Oct. 6, 2009 for corresponding Japanese Patent Application No. 2007-556749.

* cited by examiner

*Primary Examiner* — Kamini Patel
(74) *Attorney, Agent, or Firm* — Staas & Halsey LLP

(57) ABSTRACT

In order to generate a parity of output data from a priority encoder without increasing processing time or making the circuitry complex, the present invention a first level generator having a plurality of first component circuits arranged in parallel, into each of which one of a plurality of sets of a specific number of bits of the binary data in sequence from the most significant bit is input and each of which generates and outputs a first signal for parity generation of bit data of the specific number of bits and a second signal representing whether or not the entire bit data of the specific number of bits is "0s" or "1s"; and a second level generator generating the parity of the binary data based on the first signal and the second signal from each of said first component circuits of said first level generator.

19 Claims, 15 Drawing Sheets

PARITY GENERATOR, PRIORITY ENCODER, AND INFORMATION PROCESSOR

CROSS REFERENCE TO RELATED PATENT APPLICATIONS

This application is a continuing application, filed under 35 U.S.C. §111(a), of International Application PCT/JP2006/301692, filed Feb. 1, 2006, the contents of which are incorporated herein by reference.

TECHNICAL FIELD

The present invention relates to a technique to generate a parity of output data from a priority encoder which deals with binary input data.

BACKGROUND OF THE INVENTION

There has been a priority encoder which outputs output data representing a bit position at which "0" or "1" appears first from the most significant bit of the binary input data.

Conventionally, a parity bit has not been attached to output data (priority encoder result) from the priority encoder. Various methods have been proposed for parity generation. (e.g., see Patent Reference 1 below.)

However, a demand for detailed error detection has arisen, and with the intention of error detection, high-reliability processors attach parity bits for arithmetic circuits, which have not been the objects of the detection. As a part of the purpose, it is desired that a parity bit attached to output data from a priority encoder (exemplified by a leading zero counter which is used in shift amount calculation for data normalization and which counts the number of zero bits of input data from the most significant bit).

As a method for generating a parity of output data from a priority encoder, the first and second methods respectively shown in FIGS. 14 and 15 are easily conceived.

The below explanation assumes that a priority encoder outputs, as output data, the position (bit position) of the first "0" of binary input data from the most significant bit.

A parity bit is a signal which indicates whether the number of "0s" or "1s" included in data is an even number or an odd number for error detection for the data. The following example provides that, if the number of "1s" included in output data from a priority encoder is an odd number, the parity bit is "1".

For the first method, alogical EXOR (Exclusive OR) circuit 102 is disposed on the output side of priority encoder 100 and a parity of output data from priority encoder 100 is generated by calculating the exclusive OR of the same output data, as shown in FIG. 14.

For the second method, as shown in FIG. 15, a parity generating circuit 105 including a number of logical AND circuits 103 (however appears only logical AND circuits 103-0 to 103-2 in the drawing) and a single OR gate 104 generates a parity of output data from a priority encoder (not shown) on the basis of the data input (input signals Z0-Zn) into the priority encoder.

Specifically, a number of logical AND circuits 103 are arranged in parallel, and input data in increments of two bits are sequentially input into the logical AND circuits 103 from the top logical AND circuit (here, logical AND circuit 103-0). Each logic circuit is to output "1" only when the input data is in a particular pattern. The number of logical AND circuits 103 depends on the number of bits of input data and the number of bits of the increment to each logic circuit.

In other words, into the top logical AND circuit 103-0, input data Zn and the inverse of input data Zn-1 are input. Thereby "1" is output only when input data Zn is "1" and input data Zn-1 is "0".

In addition to input data Zn and input data Zn-1, input data Zn-2 and the inverse of input data Zn-3 are input into logical AND circuit 103-1. Thereby, "1" is output from logical AND circuit 103-1 only when input data Zn to Zn-2 are all "1" and the input data Zn-3 is "0".

Further, input data Zn-4 and the inverse of input data Zn-5 are input into logical AND circuit 103-2 in addition to input data Zn to Zn-3, so that "1" is output from logical AND circuit 103-2 only when input data Zn to Zn-4 are all "1" and input data Zn-5 is "0".

Into the lowest logical AND circuit 103, all the input data Zn-Z0 are input, and the logical product is calculated.

In succession, in parity generating circuit 105, logical OR circuit 104 calculates the logical sum of all the output from these logical AND circuits 103 and outputs the result of the calculation as the parity bit.

Patent Reference 1: Japanese Laid-open Patent Publication No. 2000-20332.

DISCLOSURE OF THE INVENTION

Problems to be Solved by Invention

The first method described above with reference to FIG. 14 however generates a parity using an output from priority encoder 100, and that simply adds the delay caused from parity generation to the processing time for which a priority encoder takes. Therefore, increase in processing time makes it difficult to speed up a priority encoder as compared with a conventional priority encoder which attaches no parity bit.

Besides, the second method detailed above with reference to FIG. 15 needs to input upper data pieces of input data Zn-Z0 (here, input data Zn is the upper most data) into a large number of logical AND circuits, making the circuitry extremely complex.

In addition, a large amount of input data is input into lower logical AND circuits 103 among a number of logical AND circuits 103 arranged in parallel to make the circuitry complex and prolong the processing time in logical AND circuits For example, the lowest logical AND circuit 103 needs to calculate the logical product of the entire input data Zn-Z0, thereby increasing delay.

With the foregoing problems in view, the object of the present invention is to generate a parity of output data from a priority encoder without increasing the processing time or making the circuitry complex.

Means to Solve Problem

To attain the above object, the present invention provides a parity generator, provided along with an encoder into which binary input data is input and which outputs output data representing a bit position at which "0" or "1" appears first from the most significant bit of the binary input data, for generating a parity of the output data from the encoder comprising: a first level generator having a plurality of first component circuits arranged in parallel, into each of which one of a plurality of sets of a specific number of bits of the binary input data in sequence from the most significant bit is input and each of which generates and outputs a first signal for parity generation of bit data of the specific number of bits and a second signal representing whether or not the entire bit data of the specific number of bits is "1s" or "0s"; and a second level generator generating the parity of the output data based on the first signal and the second signal from each of the first component circuits of the first level generator.

Preferably, the second level generator includes: a former generator having two or more second component circuits arranged in parallel, into each of which one of two or more sets, each including a predetermined number of a plurality of the first signals and a predetermined number of a plurality of the second signals from the plurality of first component circuits of the first level generator are input in sequence from the most significant bit, and each of which generates and outputs a third signal for parity generation of bit data of the predetermined number of first signals based on the predetermined number of first signals and the predetermined number of second signals and a fourth signal representing a logical product of the predetermined number of second signals; and a latter generator generating and outputting the parity of the output data based on two or more of the third signals and two or more of the fourth signals from the two or more second component circuits of the former generator.

Additionally, to accomplish the above object, the present invention provides a component circuit being cascade connected to component circuits into a tree shape to form a parity generator, provided along with a priority encoder into which binary input data is input and which outputs output data representing a bit position at which "0" or "1" appears first from the most significant bit of the binary input data, for generating a parity of the output data from the priority encoder, the component circuit comprising: a logical circuit generating, on the basis of bit data including a specific number of successive bits from the most significant bit or a predetermined number of parity generating signals and a predetermined number of logical product signals from a predetermined number of previous level component circuits, a parity generating signal of bit data including the specific number of bits or a parity generating signal of bit data of a predetermined number of the parity generating signals and outputting the second parity generating signal or the third parity generating signal to a subsequent level component circuit; and an AND circuit generating a logical product of the bit data including the specific number of bits or a logical product of the predetermined number of logical product signals from the predetermined number of previous level component circuits and outputs a logical product signal representing the logical product of the bit data or the logical product of the logical sum signals to the subsequent level component circuit.

Further, to obtain the above object, the present invention provides an information processor comprising: a priority encoder into which binary input data is input and which outputs output data representing a bit position at which "0" or "1" appears first from the most significant bit of the binary input data; and a parity generator, provided along with the priority encoder, generating a parity of the output data from the encoder, the parity generator including a first level generator having a plurality of first component circuits arranged in parallel, into each of which one of a plurality of sets of a specific number of bits of the binary input data in sequence from the most significant bit is input and each of which generates and outputs a first signal for parity generation of bit data of the specific number of bits and a second signal representing whether or not the entire bit data of the specific number of bits is "1s" or "0s"; and a second level generator generating the parity of the output data based on the first signal and the second signal from each of the first component circuits of the first level generator.

Still further, to gain the above object, the present invention provides a priority encoder into which binary input data is input and which outputs output data representing a bit position at which "0" or "1" appears first from the most significant bit of the binary input data, the encoder including a parity generator for generating a parity of the output data which comprises: a first level generator having a plurality of first component circuits arranged in parallel, into each of which one of a plurality of sets of a specific number of bits of the binary input data in sequence from the most significant bit is input and each of which generates and outputs a first signal for parity generation of bit data of the specific number of bits and a second signal representing whether or not the entire bit data of the specific number of bits is "1s" or "0s"; and a second level generator generating the parity of the output data based on the first signal and the second signal from each of the first component circuits of the first level generator.

Still further, to attain the above object, the present invention provides a parity generator for generating a parity of binary data comprising: a first level generator having a plurality of first component circuits arranged in parallel, into each of which one of a plurality of sets of a specific number of bits of the binary data in sequence from the most significant bit is input and each of which generates and outputs a first signal for parity generation of bit data of the specific number of bits and a second signal representing whether or not the entire bit data of the specific number of bits is "1s" or "0s"; and a second level generator generating the parity of the binary data based on the first signal and the second signal from each of the first component circuits of the first level generator.

Effects of Invention

As described above, according to the present invention, the parity generating circuit generates a parity using input data into an encoder in parallel with a process by the encoder, and the processing time is not increased.

In addition, since the parity generating circuit includes the first level generator having a number of first component circuits arranged in parallel and the second level generator generates the parity on the basis of the first signals and the second signals from the first level generator, there is no need to input a single data piece into a large number of gates without making the circuitry complex. Consequently the parity can be generated in a simple structure.

DESCRIPTION OF SYMBOLS

| | |
|---|---|
| 1, 1a, 1b, 1c | information processor |
| 2, 100 | priority encoder (encoder) |
| 3, 3a, 3b, 3c, 105 | parity generating circuit (parity generator) |
| 4, 4a, 4b, 4c | first level generator |
| 5, 5b | second level generator |
| 5-1 | former generator |
| 5-2 | latter generator |
| 6, 6c | correcting section |
| 6a, 11a, 11b, 11e, 12b-j | NOT gate |
| 6b, 11f, 11h, 12r, 12u, 12v, 103-0 to 103-2 | AND gate |
| 6d, 6e, 104 | OR gate |
| 10-1 to 10-15, 10a-1 to 10a-8, 10b-1 to 10b-5, 10c-1 to 10c-4 | first component circuit, |
| component circuit (10-1 to 10-8, 10a-1 to 10a-8, 10b-1 to 10b-4, and 10c-1 to 10c-4: | |
| 10-9 to 10-12, 10b-5: | second component circuit) |
| 11c, 11d, 12n-q | logic gate |
| 11g, 12a, 12s | buffer gate |
| 12k-m, 12t | NAND gate |
| 102 | EXOR (Exclusive OR) circuit |

BEST MODE FOR CARRYING OUT THE INVENTION

Hereinafter, embodiments of the present invention will now be described with reference to the accompanying drawings.

(1) First Embodiment

Figure 1:
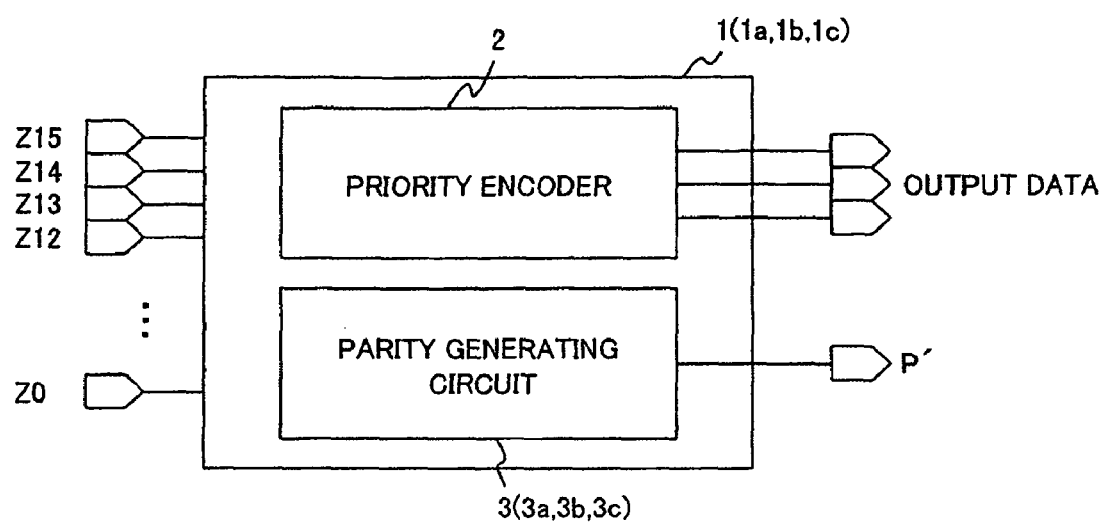
FIG. 1 is a block diagram showing the configuration of an information processor according to first through fourth embodiments of the present invention.

To begin with, an information processor according to the first embodiment of the present invention will now be described with reference to FIG. 1. As shown in FIG. 1, information processor 1 includes priority encoder (encoder) 2 and parity generating circuit 3.

Into each of priority encoder 2 and parity generating circuit 3, input data Z15-Z0 is input. Here, input data Z15-Z0 is a 16-bit binary data string expressed in the binary number system ("1s" and/or "0s"). Input data Z15 is the most significant bit (the left-most bit) and input data Z0 is the last significant bit.

Priority encoder 2 outputs output data (a priority encoder result) representing a bit position at which "0" or "1" appears first in input data Z15-Z0 from the most significant bit (input data Z15). The output data from priority encoder 2 is binary data. The bit position represented by the output data may be the position of the first "0" or the number of "1s" from the most significant bit to the first "0".

Figure 2:
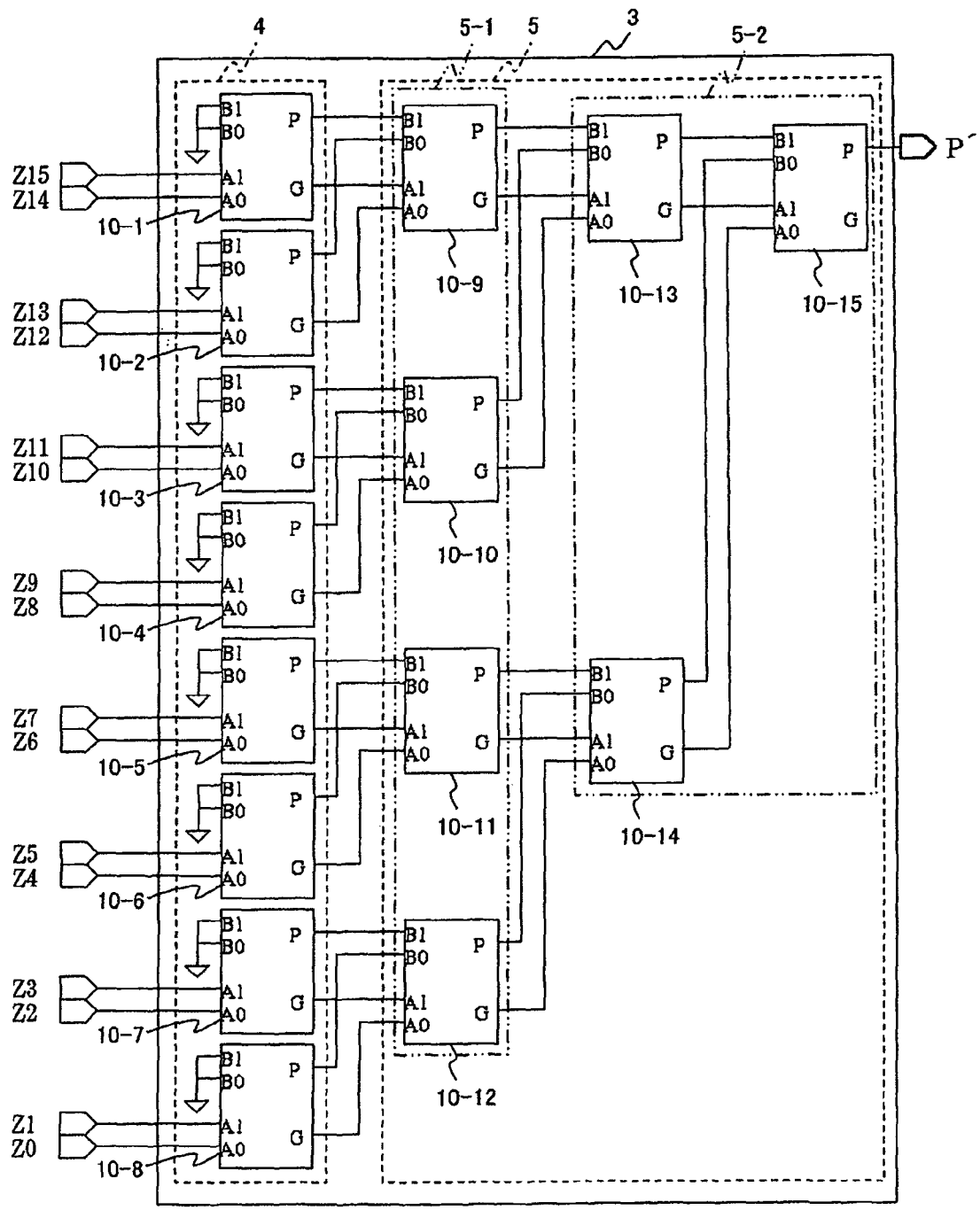
FIG. 2 is a diagram showing a parity generation circuit of the information processor of the first embodiment of the present invention.

Parity generating circuit 3 is provided along with priority encoder 2 and generates parity P' of the output data from priority encoder 2. As shown in FIG. 2, parity generating circuit 3 includes a number of component circuits 10-1 to 10-15 used in the parity generating circuit (hereinafter simply called component circuits). Hereinafter, if component circuits 10-1 to 10-15 need not be discriminated from one another, a reference number 10 is used for a component circuit.

Parity generating circuit 3 is formed by cascade connecting a number of component circuits 10-1 to 10-15 into a tree shape, as shown in FIG. 2. Here, component circuits 10-1 to 10-8 form first level generator 4 and component circuits 10-9 to 10-15 form second level generator 5. Component circuits 10-1 to 10-15 in parity generating circuit 3 are identical in configuration.

Component circuits 10-1 to 10-8 serving as first level generator 4 are arranged in parallel and in order of from component circuits 10-1 to 10-8. Each of component circuits 10-1 to 10-8 deals with a specific number (preferably 2n, where n is an integer of 1 or more, here 2 bits) of bits of input data Z15 to Z0 in sequence from the most significant bit.

Here, input data Z15 and Z14 are input into component circuit 10-1; input data Z13 and Z12, into component circuit 10-2; input data Z11 and Z10, into component circuit 10-3; input data Z9 and Z8, into component circuit 10-4; input data Z7 and Z6, into component circuit 10-5; input data Z5 and Z4, into component circuit 10-6; input data Z3 and Z2, into component circuit 10-7; and input data Z1 and Z0, into component circuit 10-8.

Each component circuits 10-1 to 10-8 generates a tentative parity bit P (first signal), which is to be used for parity generation, of bit data having a specific number of bits input therein and outputs the generated tentative parity bit P (see symbol "P" in the drawing) and concurrently generates a G signal (second signal) representing whether or not the entire bit data having a specific number of bits the component circuit in question deals is "1s" or "0s" (in this example, "1s") and outputs the generated G signal (see symbol "G" in the drawing).

In FIG. 2, symbols "A1", "A0", "B1" and "B0" in each of component circuits 10-1 to 10-8 represent inputs (or input ports). Inputs A1 and A2 correspond to input data which the component circuit deals with among input data Z15 to Z0; input A1 corresponds to upper input data and input A2 corresponds to lower input data. In addition, inputs B1 and B0 are forcibly set to be "0".

Inputs "A1", "A0", "B1" and "B0" in each of component circuits 10-9 to 10-15 are individually tentative parity bits P or G signals from a previous level component circuit 10 connected to the component circuit in question, which will be detailed below in conjunction with second level generator 5.

Here, the configuration of component circuit 10 is described with reference to FIG. 3, which shows a configuration common to all component circuits 10-1 to 10-15.

Component circuit 10 includes NOT gates 11a, 11b and 11e, logic gates 11c and 11d, and AND gate 11f.

In particular, component circuit 10 has NOT gates 11a, 11b and 11e, logic gates 11c and 11d such that following expression (1) calculates and outputs a tentative parity bit P. In the expression (1) below, XA1 represents an inverse of input A1 and XB0 represents an inverse input B0.

$$P = XA1 \cdot B1 + A1 \cdot XB0 \quad (1)$$

In addition, component circuit 10 includes AND gates 11f such that following expression (2) calculates and outputs a G signal.

$$G = A0 \cdot A1 \quad (2)$$

That is, a G signal is a logical product of input A0 and input A1.

Figure 4:
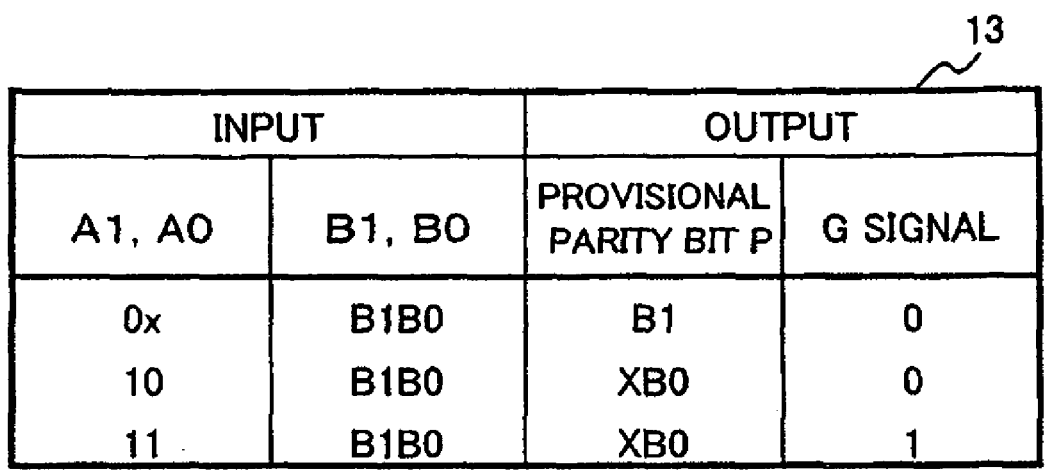
FIG. 4 is a diagram showing the relationship between input data and output data of the component circuit shown in FIG. 3.

Expressions (1) and (2) generate a tentative parity bit P and a G signal as shown in table 13 of FIG. 4. Specifically, when input "A1A0" is "00" or "01", the tentative parity bit P and the G signal are input B1 and "0", respectively.

When input "A1A0" is "10", the tentative parity bit P and the G signal are the inverse ("XB0") of input B0 and "0", respectively.

Additionally, input "A1A0" is "11", the tentative parity bit P and the G signal are the invert ("XB0") of input B0 and "1", respectively.

Next, description is made for second level generator 5. Second level generator 5 generates parity P' of the output data from priority encoder 2 based on the tentative parity bits P and the G signals from a number of first component circuits 10-1 to 10-8 of first level generator 4, and includes former generator 5-1 formed by component circuits 10-9 to 10-12 (hereinafter also called second component circuits 10-9 to 10-12) and latter generator 5-2 formed by component circuits 10-13 to 10-15.

Component circuits 10-9 to 10-12 of former generator 5-1 are sequentially arranged in parallel and each deals with a predetermined number (preferably 2$^n$, where n is an integer of 1 or more, here 2 bits) of bits of tentative parity bits P and a predetermined number (preferably 2$^n$ (where n is an integer of 1 or more), here 2 bits) of G signal in sequence from the most significant bit among the tentative parity bits P and the G signals from first component circuits 10-1 to 10-8 of first level generator 4.

Figure 3:
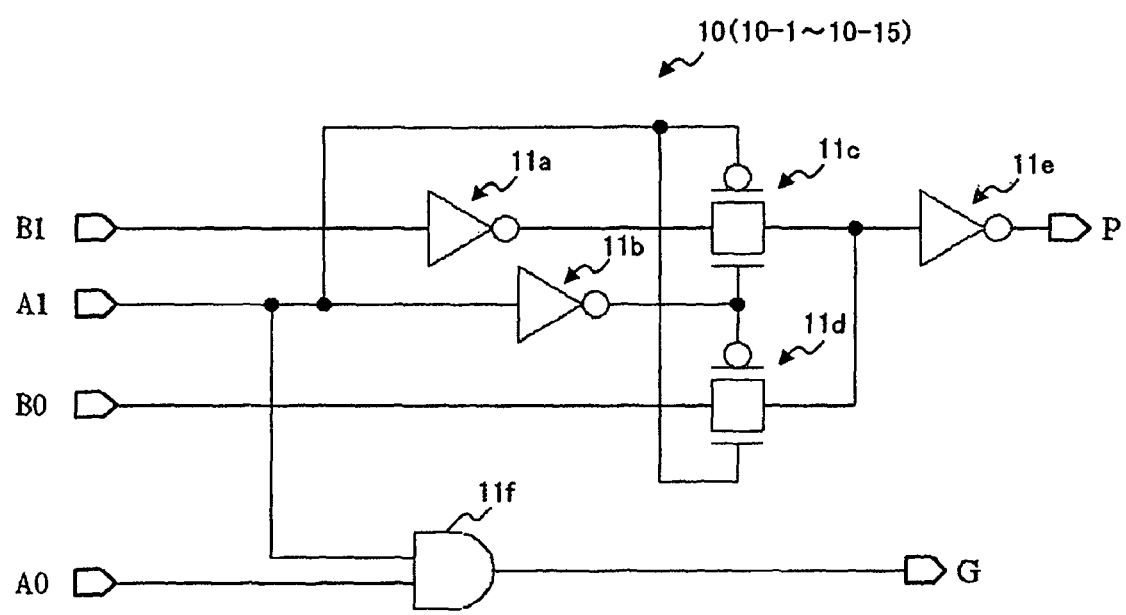
FIG. 3 is a circuit diagram showing the configuration of a component circuit used in the parity generation circuit of the information processor of the first embodiment of the present invention.

Here, the configuration of component circuits 10-9 to 10-12 are identical to those of component circuits 10-1 to 10-9 shown in FIG. 3. Into each of component circuits 10-9 to 10-12, the G signal of the upper component circuit of previous level first component circuits connected to the component circuit in question is input as input A1, and the G signal of the lower component circuit of the previous level first component circuits is input as input A0.

Further, into each of component circuits 10-9 to 10-12, the tentative parity bit P of the upper component circuit of the previous level first component circuits connected is input as input B1, and the tentative parity bit P of the lower component circuit of the previous level first component circuits is input as input B0.

Specifically, each of component circuits 10-9 to 10-12 is connected to two first component circuits 1n the previous level thereof; component circuit 10-9 is connected to previous level first component circuits 10-1 and 10-2; component circuit 10-10 is connected to previous level first component circuits 10-3 and 10-4; component circuit 10-11 is connected to previous level first component circuits 10-5 and 10-6; and component circuit 10-12 is connected to previous level first component circuits 10-7 and 10-8.

Accordingly, the G signal of first component circuit 10-1 and the G signal of first component circuit 10-2 are input as input A1 and input A0 of component circuit 10-9, respectively, and the tentative parity bit P of the first component circuit 10-1 and the tentative parity bit P of the first component circuit 10-2 are input as the input B1 and the input B0 of component circuit 10-9, respectively.

Additionally, the G signal of the first component circuit 10-3, the G signal of the first component circuit 10-4, the tentative parity bit P of the first component circuit 10-3 and the tentative parity bit of first component circuit 10-4 are input as input A1, input A0, input B1 and input B0 to component circuit 10-10, respectively.

Further, the G signal of the first component circuit 10-5, the G signal of the first component circuit 10-6, the tentative parity bit P of the first component circuit 10-5 and the tentative parity bit of first component circuit 10-6 are input as input A1, input A0, input B1 and input B0 to component circuit 10-11, respectively.

Still further, the G signal of the first component circuit 10-7, the G signal of the first component circuit 10-8, the tentative parity bit P of the first component circuit 10-7 and the tentative parity bit of first component circuit 10-8 are input as input A1, input A0, input B1 and input B0 to component circuit 10-12, respectively.

Each of second component circuits 10-9 to 10-12 generates, using above expression (1), a tentative parity bit P (third signal) for parity generation of bit data of the tentative parity bits P (first signal) from the previous level component circuits based on the inputs A1 and A0 and inputs B1 and B0, and outputs the generated tentative parity bit P.

Further, each of second component circuits 10-9 to 10-12 generates, using the above expression (2), a logical product (G signal, fourth signal) of the G signals (second signals) of the previous level first component circuits on the basis of inputs A1 and A0 and outputs the generated logical product.

Component circuits 10-13 to 10-15 of latter generator 5-2 generate a parity P1 of output data from priority encoder 2 on the basis of the tentative parity bits P and the G signals from the second component circuits 10-9 to 10-12 of former generator 5-1, and is formed by cascade connecting component circuits 10-13 to 10-15 into a tree shape.

In other words, component circuits 10-13 and 10-14 are arranged in parallel and are connected to component circuit 10-15 in the subsequent level.

In the previous level of component circuit 10-13, second component circuits 10-9 and 10-10 are connected to the component circuit in question, and in the previous level of component circuit 10-14, second component circuits 10-11 and 10-12 are connected to the component circuit in question.

In component circuit 10-13, input A1 is the G signal of second component circuit 10-9, input A0 is the G signal of second component circuit 10-10, input B1 is the tentative parity bit P of second component circuit 10-9, and input B0 is the tentative parity bit P of second component circuit 10-10.

Further, in component circuit 10-14, input A1 is the G signal of second component circuit 10-11, input A0 is the G signal of second component circuit 10-12, input B1 is the tentative parity bit P of second component circuit 10-11, and input B0 is the tentative parity bit P of second component circuit 10-12.

Similarly to the above second component circuits 10-9 to 10-12, component circuits 10-13 and 10-14 generate, using the above expressions (1) and (2), tentative parity bits P based on tentative parity bits P and G signals of the previous level component circuits connected to the component circuits.

Namely, on the basis of the tentative parity bits P (third signal) and the G signals (fourth signals) from the previous level component circuits, component circuits 10-13 and 10-14 generate and output a parity generation signal of bit data representing the tentative parity bits P which signal serves as a tentative parity bit P (third signal) destined for subsequent level component circuit 10-15, and concurrently generates and outputs the logical product of the G signals from previous level component circuits which product serves as a G signal (fourth signal) destined for the next level component circuit 10-15.

Component circuit 10-15 is the last level component circuit (i.e., the component circuit placed at the top of the tree shape), and generates and outputs a parity P' of the output data from priority encoder 2 based on the tentative parity bits P and the G signals from component circuits 10-13 and 10-14, using the above expression (1).

In this example, if the number of "1" included in the output data of priority encoder 2 is an odd number, the parity P' is "1".

As described above, in information processor 1 according to the first embodiment of the present invention, parity generating circuit 3 generates the parity P', using input data Z15-Z0 into priority encoder 2, in parallel with processing by priority encoder 2, which suppresses increase in processing time.

Figure 15:
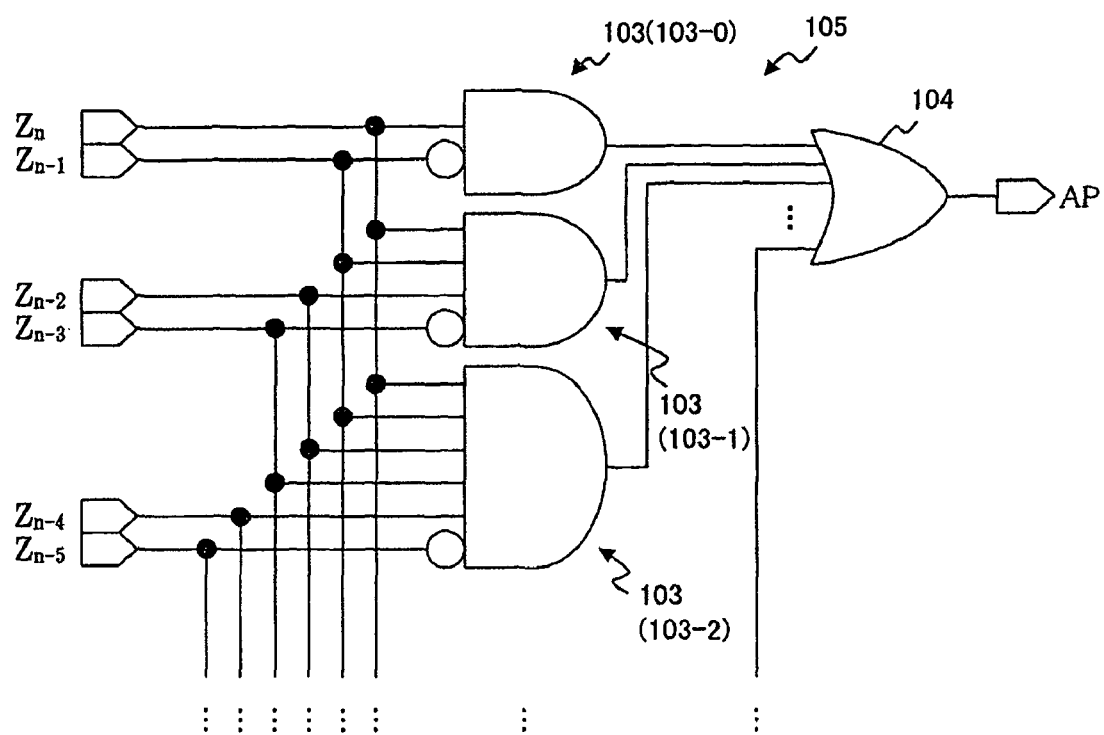
FIG. 15 is a diagram showing a part of a circuit diagram to realize a second method for generating a parity of output data from a priority encoder.

Further, since parity generating circuit 3 includes first level generator 4 in which a number of first component circuits 10-1 to 10-8 are arranged in parallel and second level generator 5 which generates the parity P' based on tentative parity bits P and G signals from first level generator 4, there is no requirement to input a single piece of input data into a large number of gates which has been carried out in the second method shown in FIG. 15, avoiding complication of the circuit. As a consequence, a parity P' can be generated in a simple structure.

In other words, parity generating circuit 3 is simplified by dividing input data Z15-Z0 into sets of two bits and cascade connecting component circuits 10-1 to 10-15, each having a construct unit of two bits, into a tree shape.

In addition, parity generating circuit 3 need not calculate a logical product of a large number of pieces of data (e.g., the entire input data) as performed in the above second method, and can therefore rapidly generate a parity p'.

Further, since parity generating circuit 3 is formed by cascade connecting first component circuits 10-1 to 10-8 which form first level generator 4 and component circuits 10-9 to 10-15 which form second level generator 5 into a tree shape, connection among the component circuits is simplified and a parity P' is generated in a configuration avoiding complication.

(2) Second Embodiment

Next, the second embodiment of the present invention will now be described. As shown in FIG. 1, information processor 1a of the second embodiment also includes priority encoder 2 and parity generating circuit 3a. As compared with information processor 1 of the above first embodiment, information processor 1a of this embodiment is different in the configuration (particularly first component circuits 10a-1 to 10a-8 to be detailed below (see FIGS. 5 and 6)) of parity generating circuit 3a.

Therefore, description of a part of information processor 1a common to information processor 1 of the first embodiment described above is omitted here, and hereinafter, description will be made in relation to a different part from information processor 1 of the first embodiment.

Figure 5:
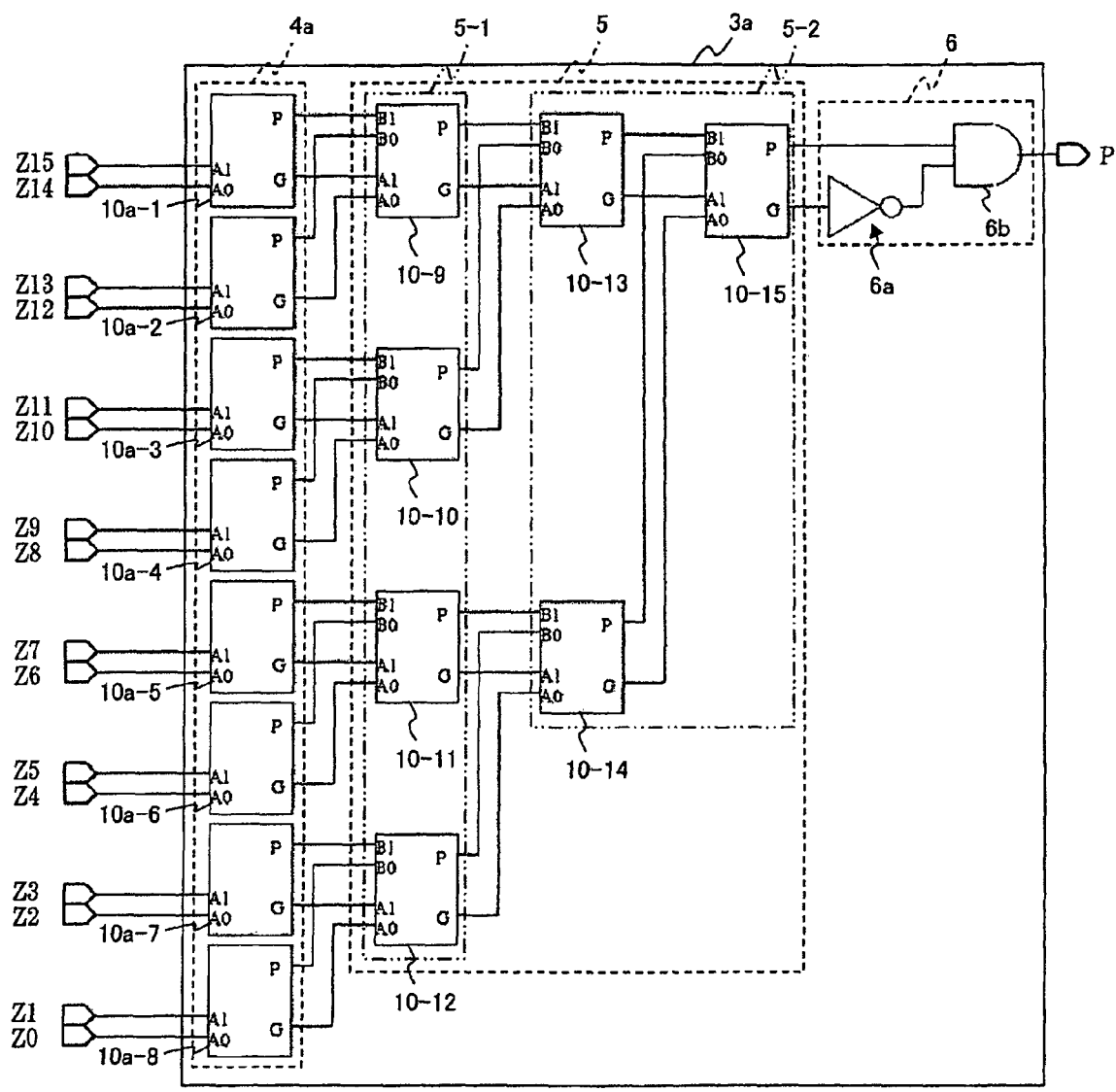
FIG. 5 is a diagram showing a parity generation circuit of the information processor of the second embodiment of the present invention.

FIG. 5 is a diagram showing the configuration of parity generating circuit 3a of information processor 1a. In FIG. 5, a reference number identical to a reference number already mentioned represents an identical or a substantially identical part, so any repetitious description is omitted here.

As shown in FIG. 5, parity generating circuit 3a of information processor 1a is formed by first level generator 4a in which first component circuits 10a-1 to 10a-8 are arranged in parallel, second level generator 5 which includes second component circuits 10-9 to 10-15, and correcting section 6. First component circuits 10a-1 to 10a-8 and second component circuits 10-9 to 10-15 are cascade connected into a tree shape.

Figure 6:
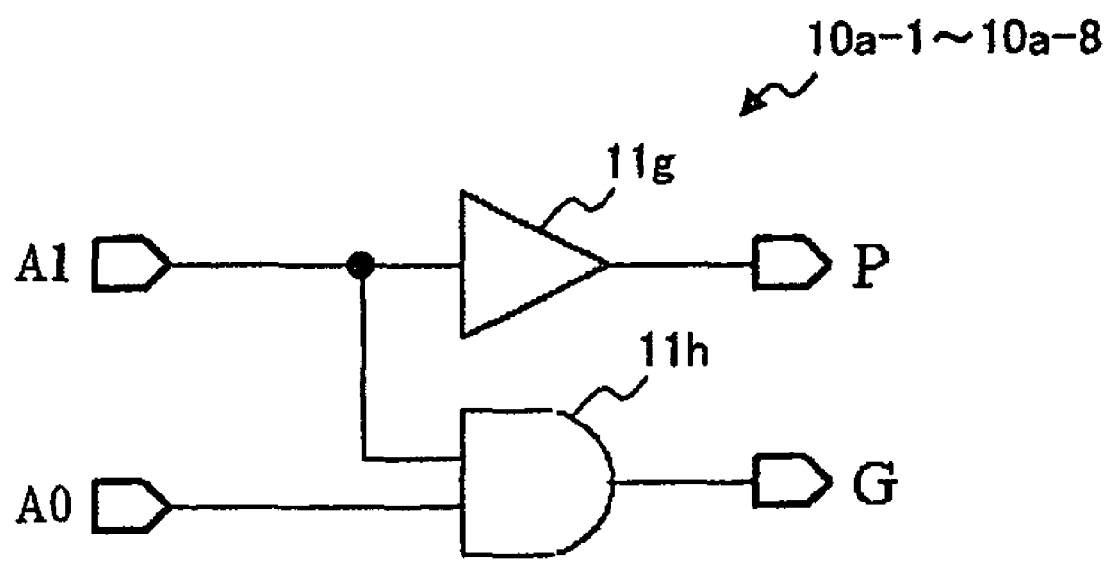
FIG. 6 is a circuit diagram showing the configuration of a first component circuit of the parity generation circuit of the information processor of the second embodiment.

First component circuits 10a-1 to 10a-8 that form first level generator 4a are different in configuration from second component circuits 10-9 to 10-15, and each is equipped with only inputs A1 and A0, as shown in FIG. 6.

Specifically, each of first component circuits 10a-1 to 10a-8, as shown in FIG. 6, includes buffer gate 11g and AND gate 11h, into which only two-bit input data is input, and therefore does not include inputs B1 and B0, which are included in first component circuits 10-1 to 10-8 of the first embodiment.

With this configuration, each of first component circuits 10a-1 to 10a-8 outputs input A1 as a tentative parity bit P (first signal) and concurrently outputs the logical product of inputs A1 and A0 as a G signal (second signal).

Similarly to first component circuits 10-1 to 10-8 of the first embodiment described above, into component circuit 10a-1, input data Z15 and Z14 are input respectively as inputs A1 and A0; into component circuit 10a-2, input data Z13 and Z12 are input respectively as inputs A1 and A0; into component circuit 10a-3, input data Z11 and Z10 are input respectively as inputs A1 and A0; into component circuit 10a-4, input data Z9 and Z8 are input respectively as inputs A1 and A0; into component circuit 10a-5, input data Z7 and Z6 are input respectively as inputs A1 and A0; into component circuit 10a-6, input data Z5 and Z4 are input respectively as inputs A1 and A0; into component circuit 10a-7, input data Z3 and Z2 are input respectively as inputs A1 and A0; and into component circuit 10a-8, input data Z1 and Z0 are input respectively as inputs A1 and A0.

Correcting section 6 generates a parity P' based on tentative parity bit P and G signal output from the last level component circuit 10-15, and includes NOT gate 6a and AND gate 6b.

Specifically, in correcting section 6, the G signal output from the previous level component circuit 10-15 is inverted by NOT gate 6a and the logical product of the inverted. G signal and the tentative parity bit P is calculated by AND gate 6b, so that the parity P' is generated.

In parity generating circuit 3a, due to the configuration of first level generator 4a, the entire input data Z15-Z0 being "1s" outputs an error value for a parity generated by first level generator 4a and second level generator 5 (i.e., a tentative parity bit P output from component circuit 10-15). However, correction of the tentative parity bit P output from component circuit 10-15 by correcting section 6 makes it possible to output the correct value even in the above case. In other words, if the entire input data Z15-Z0 is "1s", correcting section 6 corrects the output data from the last level component circuit 10-15 to solve an error caused by simplification of component circuits 10a-1 to 10a-8.

Information processor 1a of the second embodiment of the present invention guarantees the same effects as the first embodiment, and additionally can make the configuration of first component circuits 10a-1 to 10a-8 which form first level generator 4a to be simpler than those of information processor 1 of the first embodiment described above, thereby reducing the number of transistors and consequently reducing the power requirements.

(3) Third Embodiment

Next, an information processor according to the third embodiment of the present invention will now be described. As shown in FIG. 1, information processor 1b of the third embodiment of the present invention also includes priority encoder 2 and parity generating circuit 3b, and is different in the configuration of parity generating circuit 3a from information processor 1 of the first embodiment described above (see FIGS. 7 and 8 to be detailed below).

Figure 7:
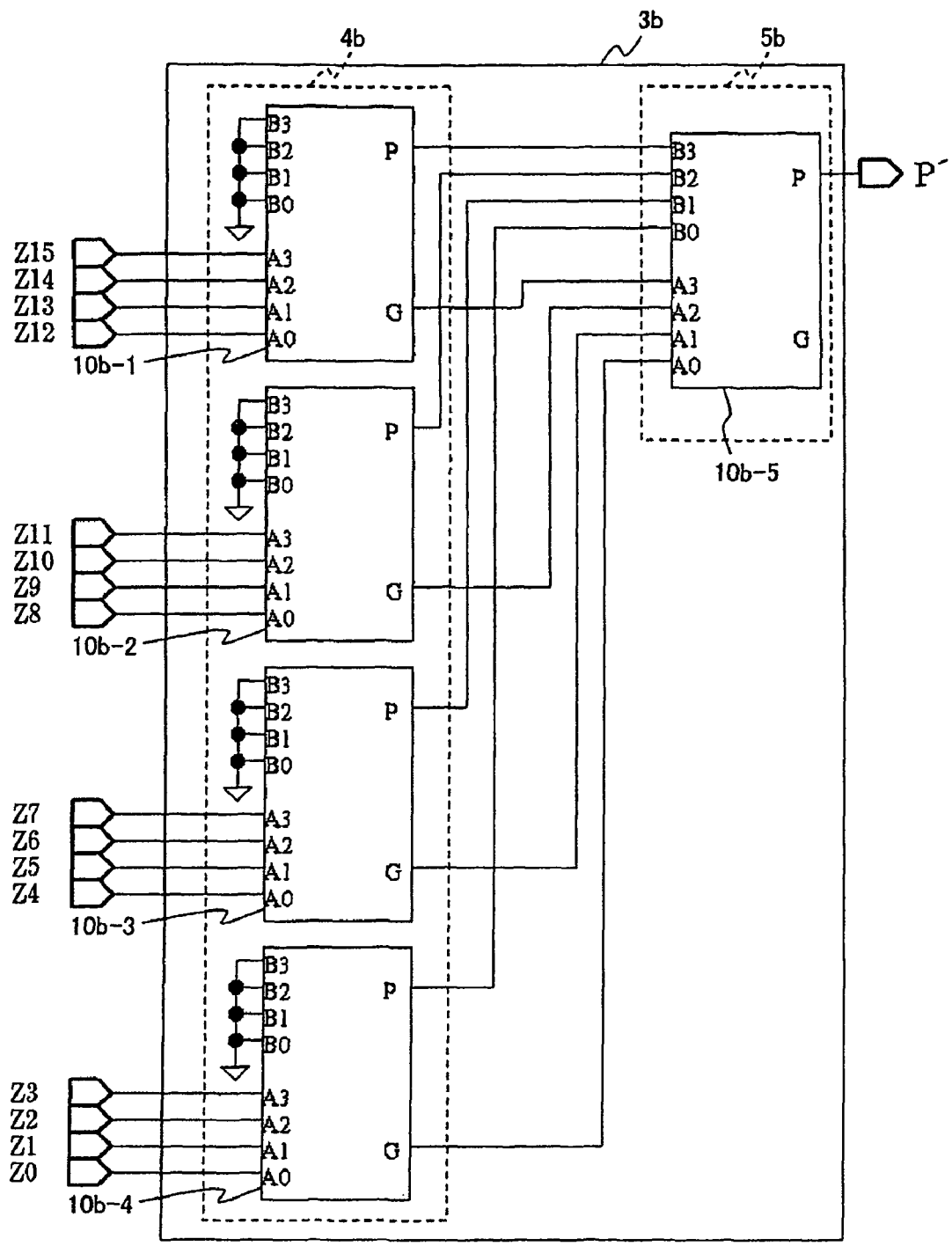
FIG. 7 is a diagram showing a parity generation circuit of the information processor of the third embodiment of the present invention.

FIG. 7 is a diagram showing the configuration of parity generating circuit 3b of information processor 1b. In FIG. 7, a reference number identical to a reference number already mentioned represents an identical or a substantially identical part, so any repetitious description is omitted here.

As shown in FIG. 7, parity generating circuit 3b of the present information processor 1b is formed by cascade connecting a number of component circuits 10b-1 and 10b-5 into a tree shape; component circuits 10b-1 to 10b-4 form first level generator 4b and component circuit functions as second level generator 5b.

The present information processor 1b includes component circuits 10b-1 to 10b-5 each of which deals a four-bit input in contrast to component circuits 10-1 to 10-115 (sic, correctly 10-15) of the first embodiment each of which deals a two-bit input.

As to each of component circuits 10b-1 to 10b-4 arranged in parallel, into component circuit 10b-1, input data Z15 to Z12 are input; into component circuit 10b-1 (sic, correctly 10b-2), input data Z11 to Z8 are input; into component circuit 10b-1 (sic, correctly 10b-3), input data Z7 to Z4 are input; and into component circuit 10b-1 (sic, correctly 10b-4), input data Z3 to Z0 are input.

Reference numbers "A3", "A2", "A1", "A0", "B3", "B2", "B1", and "B1" (sic, correctly "B0") of each of component circuits 10b-1 to 10b-5 represent input (or input ports) in FIG. 7.

In first component circuit 10b-1 to 10b-4, each of inputs "A3" to "A0" represents one of input data Z15-Z0 and inputs "B3" to "B0" are forcibly set to "0".

Specifically, in first component circuit 10b-1, input data Z15, input data Z14, input data Z13 and input data Z12 are inputs "A3", "A2", "A1", and "A0", respectively. In first component circuit 10b-2, input data Z11, input data Z10, input data Z9 and input data Z8 are inputs "A3", "A2", "A1", and "A0", respectively. In first component circuit 10b-3, input data Z7, input data Z6, input data Z5 and input data Z4 are inputs "A3", "A2", "A1", and "A0", respectively. In first component circuit 10b-4, input data Z3, input data Z2, input data Z1 and input data Z0 are inputs "A3", "A2", "A1", and "A0", respectively.

In component circuit 10b-5 serving as second level generator 5b, G signals generated in first component circuits 10b-1, 10b-2, 10b-3 and 10b-4 are input into inputs A3, A2, A1, and A0, respectively.

Into inputs B3, B2, B1, and B0 of component circuit 10b-5, tentative parity bits P generated by first component circuits 10b-1, 10b-2, 10b-3 and 10b-4 are input, respectively.

Figure 8:
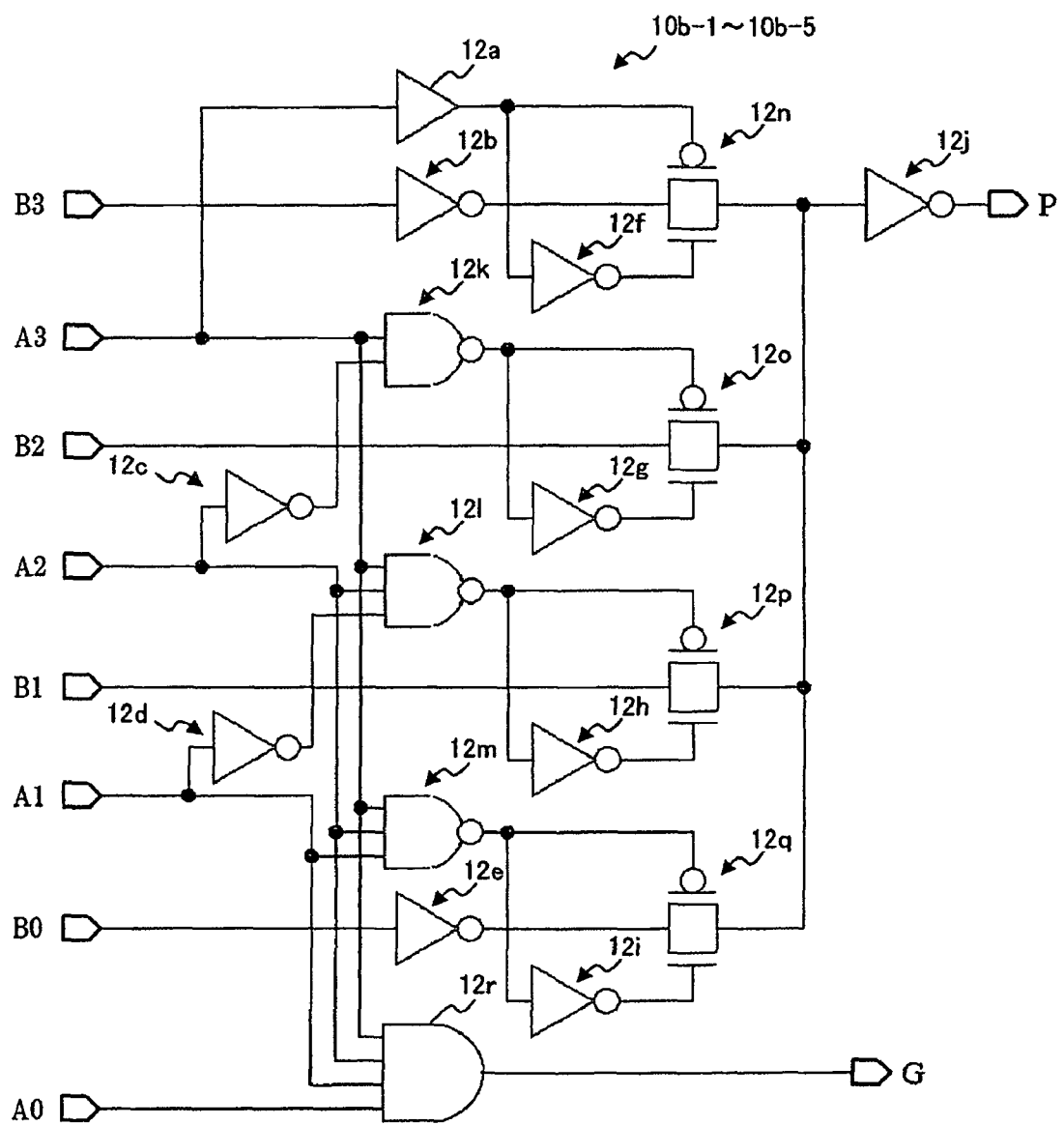
FIG. 8 is a circuit diagram showing the configuration of a component circuit used in the parity generation circuit of the information processor of the third embodiment of the present invention.

As shown in FIG. 8, each of component circuits 10b-1 to 10b-5 includes buffer gate 12a, NOT gates 12b-12i, NAND gates 12k-12m, logic gates 12n-12q, and AND gate 12r. In following expression (3), XA3 represents the inverse of input A3; XA2, the inverse of input A2; XA1, the inverse of input A1; XB2, the inverse of input B2; and XB1, the inverse of input B1.

$$P = XA3 \cdot B3 + A3 \cdot XA2 \cdot XB2 + A3 \cdot A2 \cdot XA1 \cdot XB1 + A3 \cdot A2 \cdot A1 \cdot B0 \quad (3)$$

In addition, each of component circuits 10b-1 to 10b-5 includes AND gate 12g used to calculate a G signal (second signal) by below expression (4), which signal is to be output.

$$G = A3 \cdot A2 \cdot A1 \cdot A0 \quad (4)$$

Namely, the G signal is the logical product of inputs A0 to A3.

Figure 9:
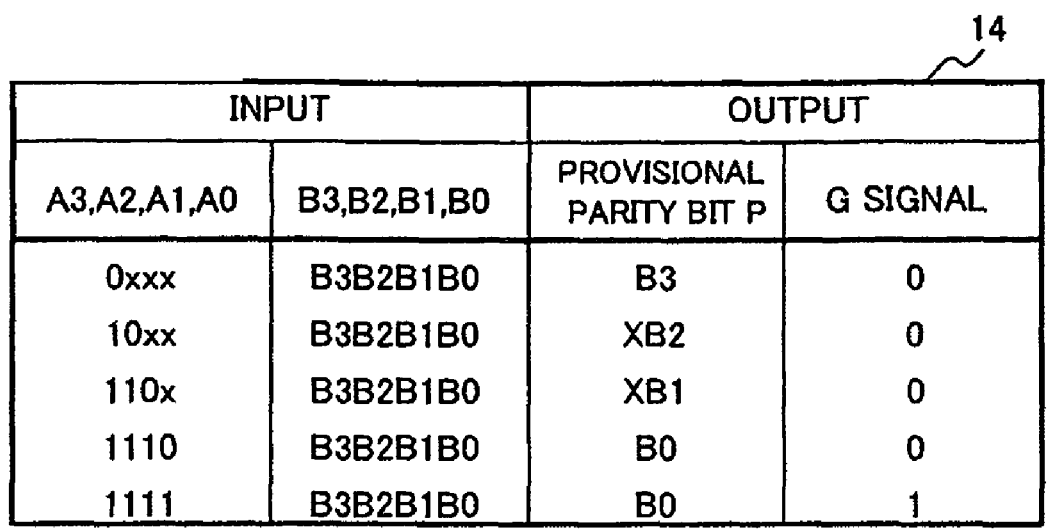
FIG. 9 is a diagram showing the relationship between input data and output data of the component circuit shown in FIG. 8.

With expressions (3) and (4), tentative parity bits p (or a parity bit P') and G signals are generated as shown in table 14 of FIG. 9. Concretely, when input A3 in input "A3A2A1A0" is "0", the tentative parity bit P and the G signal are input "B3" and "0", respectively.

When input A3 and input A2 in input "A3A2A1A0" are "1" and "0", respectively, the tentative parity bit P and the G signal are the inverse ("XB2") of input B2 and "0", respectively.

Further, when input A3 and input A2 and input A1 in input "A3A2A1A0" are "1", "1", and "0", respectively, the tentative parity bit P and the G signal are the inverse ("XB1") of input B1 and "0", respectively.

Input "A3A2A1A0" being "1110" makes the tentative parity bit P and the G signal be input B0 and "0", respectively.

Input "A3A2A1A0" being "1111" makes the tentative parity bit P and the G signal to be input B0 and "1", respectively.

As described above, in addition to the same results as the above first embodiments, information processor 1b of the third embodiment generates a parity bit P' and simplifies the circuitry, using five component circuits by dividing input data Z15-Z0 into four-bit sets and cascade connecting component circuits 10b-1 to 10b-5, whose construct unit is four bits, into a tree shape.

(4) Fourth Embodiment

Next, the fourth embodiment of the present invention will now be described. As shown in FIG. 1, information processor 1c of the fourth embodiment of the present invention also includes priority encoder 2 and parity generating circuit 3c, and different in the configuration of parity generating circuit 3c (particularly, first component circuits 10c-1 to 10c-4 (see FIGS. 10 and 11) detailed below) from information processor 1b of the above third embodiment.

In other words, similar to the modification of information processor 1b of the second embodiment to information processor 1 of the first embodiment, information processor 1c does not include inputs B3 to B0 in the first component circuits 10c-1 to 10c-4, which are therefore simpler in configuration than first component circuits 10b-1 to 10b-4 in information processor 1b of the third embodiment described above.

Figure 10:
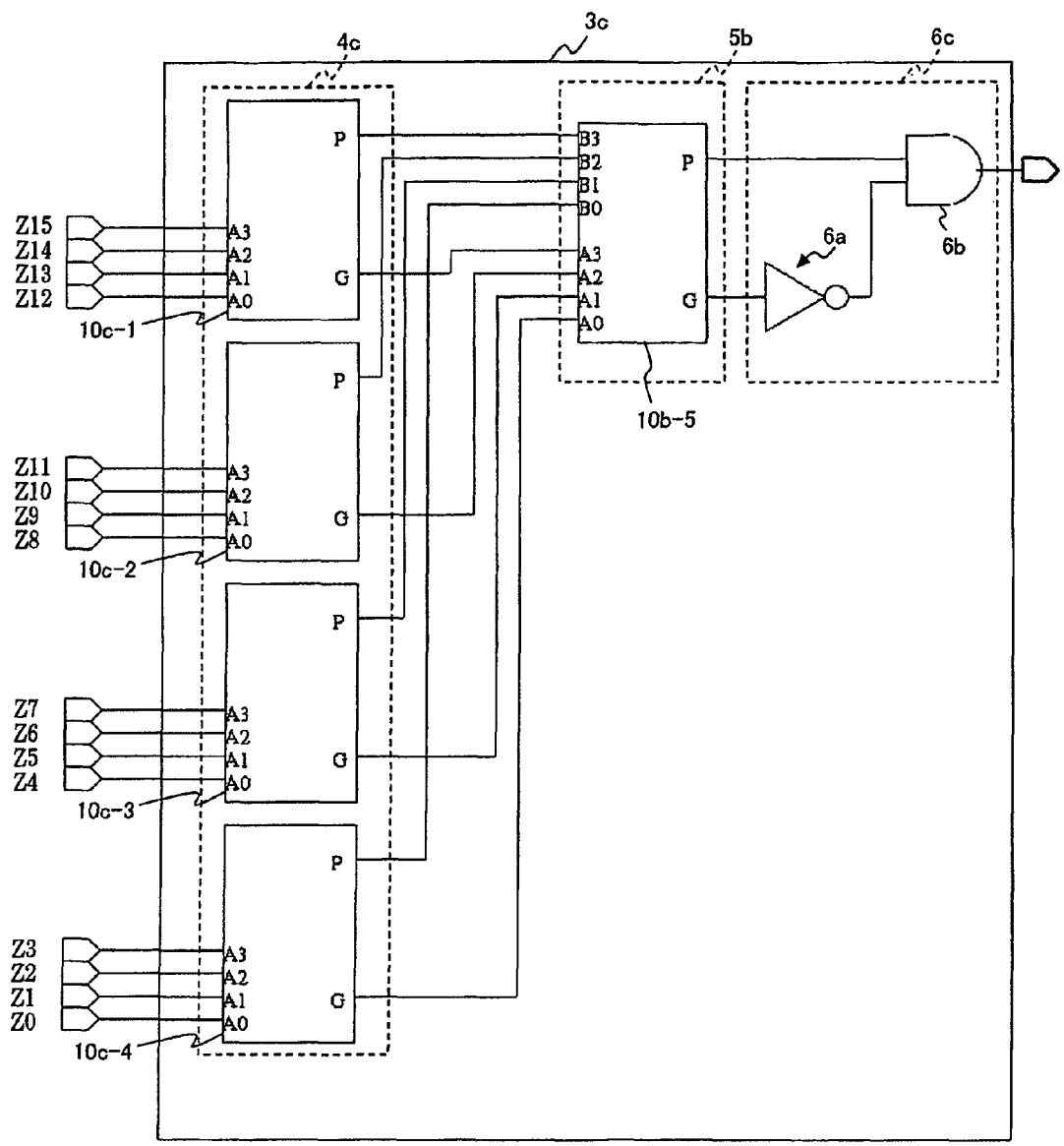
FIG. 10 is a diagram showing a parity generation circuit of the information processor of the fourth embodiment of the present invention.

FIG. 10 is a diagram showing the configuration of parity generating circuit 3c of information processor 1c. In FIG. 10, a reference number identical to a reference number already mentioned represents an identical or a substantially identical part, so any repetitious description is omitted here.

As shown in FIG. 10, parity generating circuit 3c of the present information processor 1c includes first level generator 4c in which first component circuits 10c-1 to 10c-4 are arranged in parallel, second level generator 5b formed by component circuit 10b-5, and correcting section 6c. Component circuits 10c-1 to 10c-4 and component circuit 10b-5 are cascade connected into a tree shape.

Figure 11:
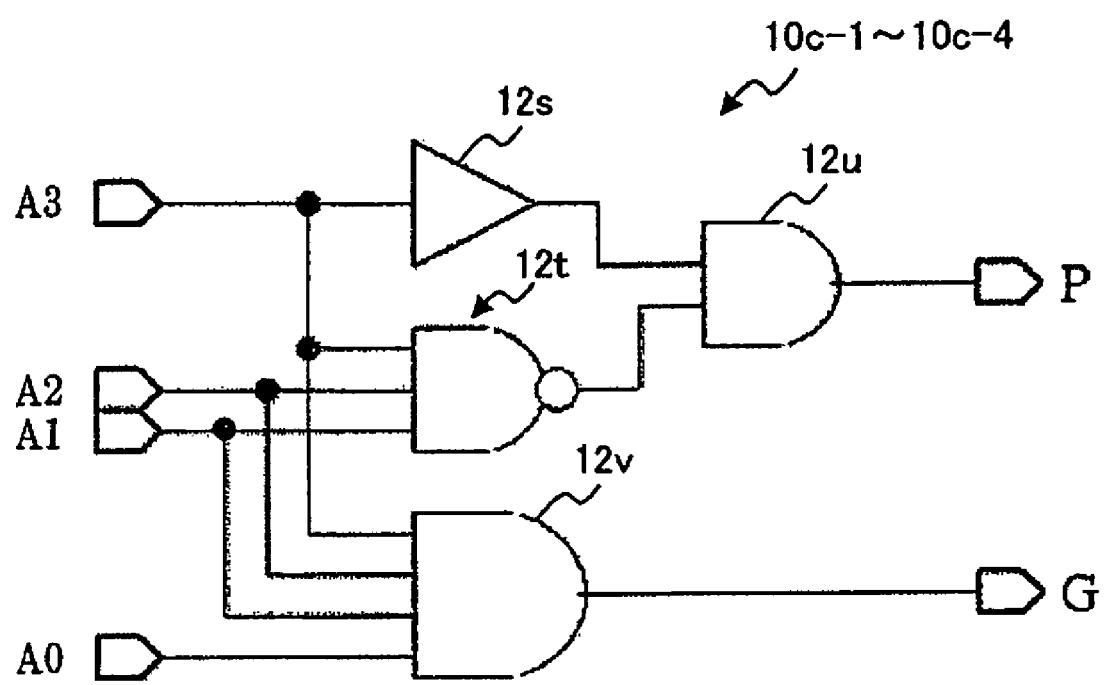
FIG. 11 is a circuit diagram showing the configuration of a first component circuit used in the parity generation circuit of the information processor of the fourth embodiment of the present invention.

First component circuits 10c-1 to 10c-4 forming first level generator 4c includes only inputs "A3", "A2", "A1", and "A0", as shown in FIG. 11.

Specifically, each of first component circuits 10c-1 to 10c-4 includes, as shown in FIG. 11, buffer gate 12s, NAND gate 12t, and AND gates 12u and 12v, and does not include inputs "B3", "B2", "B1", and "B0" possessed by first component circuits 10b-1 to 10b-4 of the above third embodiment.

With this configuration, each of first component circuits 10c-1 to 10c-4 outputs the logical sub of input A3 and the inverted ANDs of inputs A3 to A1 as a tentative parity bit P (first signal) and concurrently outputs the logical product of inputs A3 to A0 as a G signal (second signal).

Correcting section 6c generates a parity P' based on tentative parity bit P and G signal output from the last level component circuit 10-5, and includes NOT gate 6a and AND gate 6b.

Specifically, in correcting section 6c, the G signal output from the previous level component circuit 10-15 is inverted by NOT gate 6a and the logical product of the inverted G signal and the tentative parity bit P is calculated by AND gate 6b, so that the parity P' is generated.

In parity generating circuit 3c, due to the configuration of first level generator 4c, the entire input data Z15-Z0 being "1s" outputs an error value for a parity generated by first level generator 4c and second level generator 5b (i.e., a tentative parity bit P output from component circuit 10b-5). However, correction of the tentative parity bit P output from component circuit 10b-5 by correcting section 6c makes it possible to output the correct value even in the above case. In other words, if the entire input data Z15-Z0 is "1s", correcting section 6c corrects the output data from the last level component circuit 10b-5 to solve an error caused by simplification of component circuits 10c-1 to 10c-4.

Information processor 1c of the fourth embodiment guarantees the same effects as the above third embodiment, and additionally makes the first level generator 4c simpler in configuration than that of information processor 1b of the third embodiment. That reduces the number of transistors and consequently reduces the power requirements.

(5) Others

The present invention should by no means be limited to the foregoing embodiments, and various changes and combinations can be suggested without departing from the sprit of the present invention.

For example, parity generating circuit 3 (3a-3c) takes the separated form from priority encoder 2, but the present invention is not limited to this. Alternatively, priority encoder 2 may include parity generating circuit 3 (3a-3c) therein.

In addition, priority encoder 2 outputs the position (bit position) at which the first "0" appears in input data Z15-Z0 in the foregoing embodiments, but the present invention is not limited to this. Alternatively, priority encoder 2 may output the position of the first "1" in input data Z15-Z0.

Further, parity generating circuit 3 (3a-3c) in the examples of the foregoing embodiments outputs "1" if the number of "1s" in the output data from priority encoder 2 is an odd number, but the present invention is not limited to this. Alternatively, parity generating circuit 3 (3a-3c) may output "1" if the number of "1s" in the output data is an even number, may output "1" if the number of "0s" in the output data is an odd number or may output "1" if the number of "0s" is an even number.

Description is made providing that each component circuits 10 in the first and second embodiments deals with a two-bit input and that of the third and fourth embodiments deals with a four-bit input, but the present invention is not limited to the provision. The present invention may be alternatively realized with component circuits which deals with an input including a number (preferably $2^n$ bits (where, n is an integer or 1 or more)) of bits other than two or four.

Further, with the intention of enhancement of parity generation speed, parity generating circuit 3 may be realized by an appropriate combination of component circuits of the above first and second embodiments which deal with two-bit inputs and those of the above third and fourth embodiment which deal with four-bit inputs. For example, first level generator 4 may be formed by component circuits which deal with two-bit inputs and second level generator 5 may be formed by one or more component circuits which deal with four-bit inputs.

The foregoing embodiments are described assuming that the bit number of input data Z15-Z0 is an even number, but the present invention is not limited to this. The number of bits in input data may be an odd number.

Figure 12:
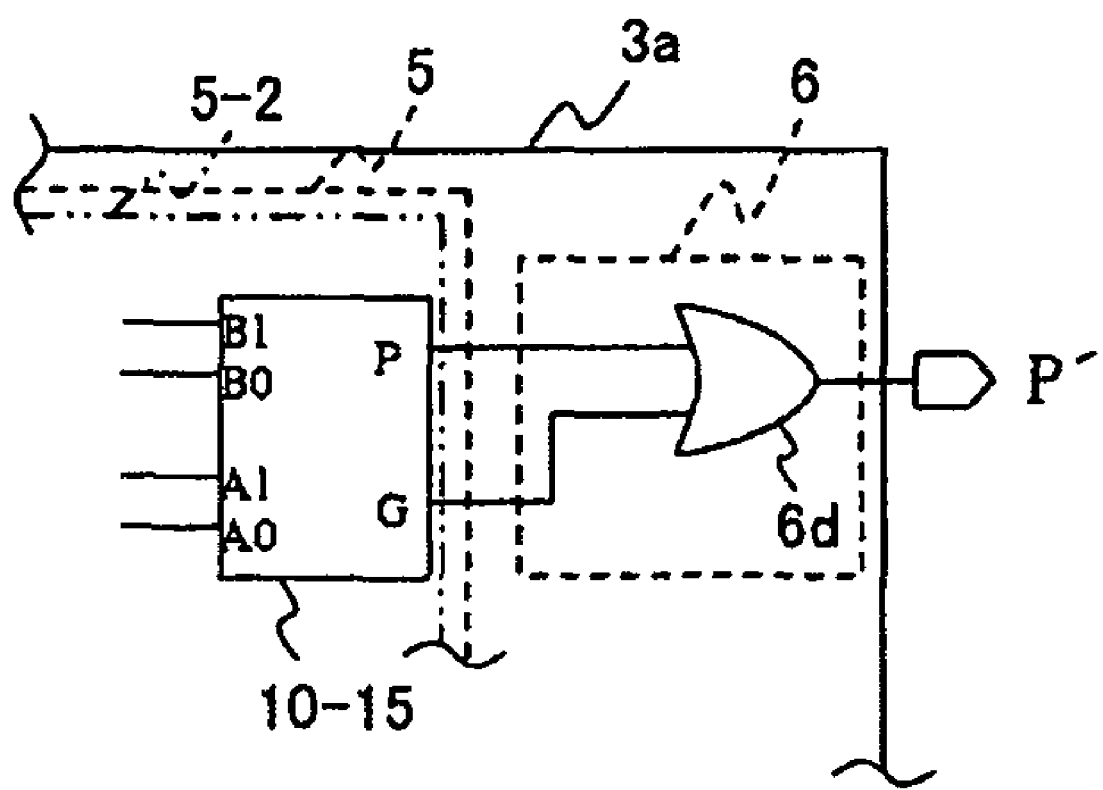
FIG. 12 is a diagram showing the configuration of apart (mainly a correcting section) of the information processor according to a modification of the present invention.

If the number of bits in input data is an odd number, correcting section 6 in parity generating circuit 3a of information processor 1a of the second embodiment includes only OR gate 6d as shown in FIG. 12, which guarantees the same effects as the above second embodiment.

Figure 13:
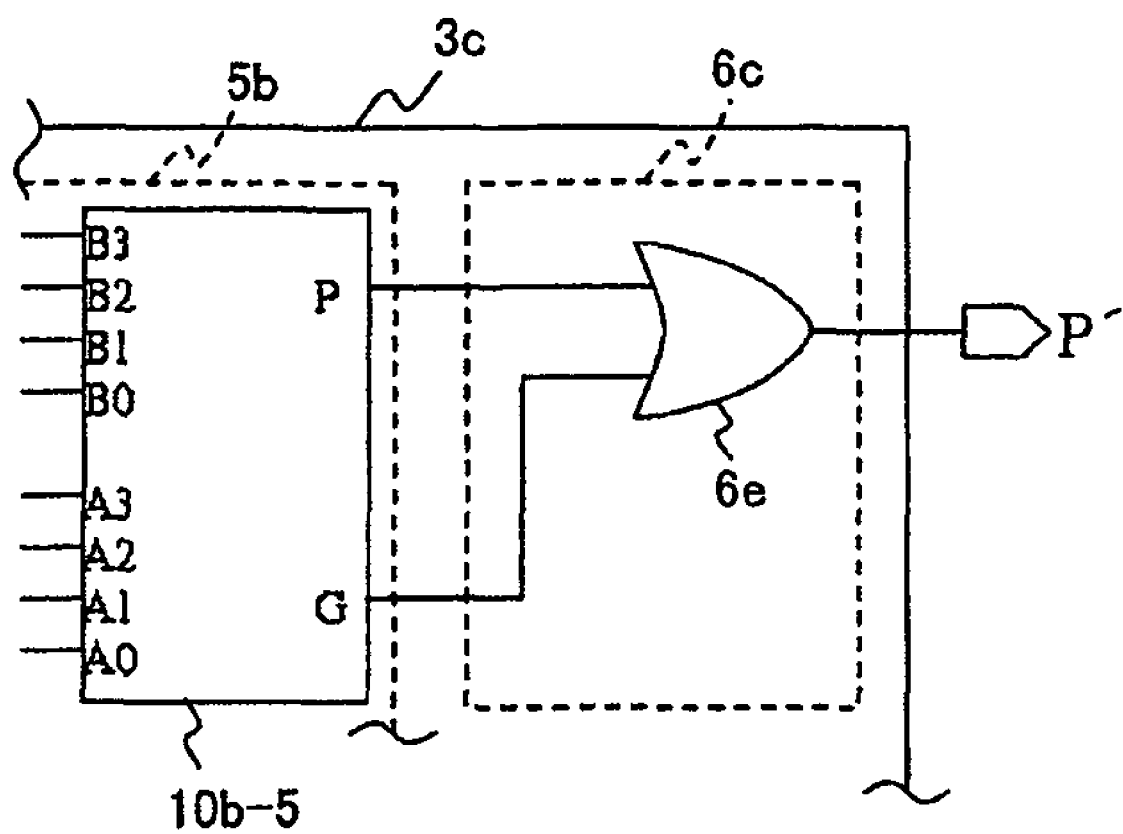
FIG. 13 is a diagram showing the configuration of apart (mainly a correcting section) of the information processor according to a modification of the present invention.
Figure 14:
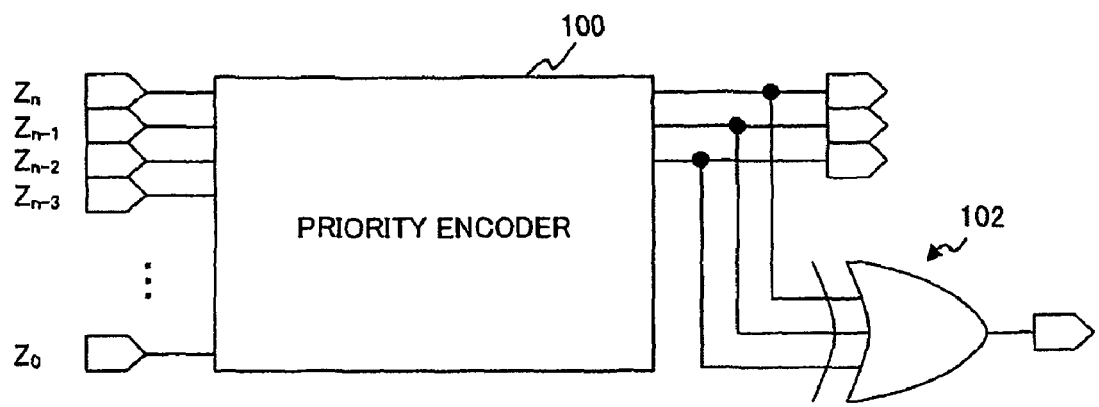
FIG. 14 is a diagram showing a configuration to realize a first method for generating a parity of output data from a priority encoder.

Further, if the number of bits in input data is an odd number, correcting section 6c in parity generating circuit 3c of information processor 1c of the above fourth embodiments includes only OR gate 6e as shown in FIG. 13, which ensures the same effects as the above fourth embodiment.

What is claimed is:

1. A parity generator, provided along with a priority encoder into which binary input data is input and which outputs output data representing a bit position at which "0" or "1" appears first from the most significant bit of the binary input data, for generating a parity of the output data from the priority encoder, the parity generator comprising:
a first level generator having a plurality of first component circuits arranged in parallel, into each of which one of a plurality of sets of a specific number of bits of the binary input data in sequence from the most significant bit is input and each of which generates and outputs a first signal for parity generation of bit data of the specific number of bits and a second signal representing whether or not the entire bit data of the specific number of bits is "1s" or "0s"; and
a second level generator generating the parity of the output data based on the first signal and the second signal from each of the first component circuits of the first level generator.

2. A parity generator according to claim 1, wherein the second level generator includes:
a former generator having two or more second component circuits arranged in parallel, into each of which one of two or more sets, each including a predetermined number of a plurality of the first signals and a predetermined number of a plurality of the second signals from the plurality of first component circuits of the first level generator are input in sequence from the most significant bit, and each of which generates and outputs a third signal for parity generation of bit data of the predetermined number of first signals based on the predetermined number of first signals and the predetermined number of second signals and a fourth signal representing a logical product of the predetermined number of second signals; and a latter generator generating the parity of the output data based on two or more of the third signals and two or more of the fourth signals from the two or more second component circuits of the former generator.

3. A parity generator according to claim 2, wherein the latter generator is formed by cascade connecting a number of component circuits identical in configuration with the second component circuits of the former generator into a tree shape.

4. A parity generator according to claim 3, wherein each of the component circuits of the latter generator generates and outputs a third signal, destined for a subsequent level component circuit, for parity generation of bit data of a particular number of the third signals based on the particular number of third signals and a particular number of the fourth signals from a particular number of previous level component circuits, and generates and outputs a logical product of the particular number of fourth signals from the particular number of previous level component circuits, as a fourth signal destined for the subsequent level component circuit.

5. A parity generator according to claim 2, wherein the first component circuits are identical in configuration with the second component circuits.

6. A parity generator according to claim 2, wherein the predetermined number of data that are to be input into each of the two or more second component circuits is $2^n$ (where, n is an integer of 1 or more).

7. A parity generator according to claim 1, wherein the specific number of bits of data that is to be input into each of the plurality of first component circuits is $2^n$ (where, n is an integer of 1 or more).

8. An information processor comprising:
a priority encoder into which binary input data is input and which outputs output data representing a bit position at which "0" or "1" appears first from the most significant bit of the binary input data; and
a parity generator, provided along with the priority encoder, generating a parity of the output data from the priority encoder,
the parity generator including
a first level generator having a plurality of first component circuits arranged in parallel, into each of which one of a plurality of sets of a specific number of bits of the binary input data in sequence from the most significant bit is input and each of which generates and outputs a first signal for parity generation of bit data of the specific number of bits and a second signal representing whether or not the entire bit data of the specific number of bits is "1s" or "0s"; and
a second level generator generating the parity of the output data based on the first signal and the second signal from each of the first component circuits of the first level generator.

9. An information processor according to claim 8, wherein the second level generator includes:
a former generator having two or more second component circuits arranged in parallel, into each of which one of two or more sets, each including a predetermined number of a plurality of the first signals and a predetermined number of b a plurality of the second signals from the plurality of first component circuits of the first level generator are input in sequence from the most significant bit, and each of which generates and outputs a third signal for parity generation of bit data of the predetermined number of first signals based on the predetermined number of first signals and the predetermined number of second signals and a fourth signal representing a logical product of the predetermined number of second signals; and a latter generator generating the parity of the output data based on two or more of the third signals and two or more of the fourth signals from the two or more second component circuits of the former generator.

10. An information processor according to claim 9, wherein the latter generator is formed by cascade connecting a number of component circuits identical in configuration with the second component circuits of the former generator into a tree shape.

11. An information processor according to claim 10, wherein each of the component circuits of the latter generator generates and outputs a third signal, destined for a subsequent level component circuit, for parity generation of bit data of a particular number of the third signals based on the particular number of third signals and a particular number of the fourth signals from a particular number of previous level component circuits, and generates and outputs a logical product of the particular number of fourth signals from the particular number of previous level component circuits, as a fourth signal destined for the subsequent level component circuit.

12. An information processor according to claim 9, wherein the first component circuits are identical in configuration with the second component circuits.

13. An information processor according to claim 9, wherein the predetermined number of data that are to be input into each of the two or more second component circuits is $2^n$ (where, n is an integer of 1 or more).

14. An information processor according to claim 8, wherein the specific number of bits of data that is to be input into each of the plurality of first component circuits is $2^n$ (where, n is an integer of 1 or more).

15. A priority encoder into which binary input data is input and which outputs output data representing a bit position at which "0" or "1" appears first from the most significant bit of the binary input data, the priority encoder including a parity generator for generating a parity of the output data, the parity generator comprising:
a first level generator having a plurality of first component circuits arranged in parallel, into each of which one of a plurality of sets of a specific number of bits of the binary input data in sequence from the most significant bit is input and each of which generates and outputs a first signal for parity generation of bit data of the specific number of bits and a second signal representing whether or not the entire bit data of the specific number of bits is "1s" or "0s"; and
a second level generator generating the parity of the output data based on the first signal and the second signal from each of the first component circuits of the first level generator.

16. A priority encoder according to claim 15, wherein the second level generator includes:
a former generator having two or more second component circuits arranged in parallel, into each of which one of two or more sets, each including a predetermined number of a plurality of the first signals and a predetermined number of a plurality of the second signals from the plurality of first component circuits of the first level generator are input in sequence from the most significant bit, and each of which generates and outputs a third signal for parity generation of bit data of the predetermined number of first signals based on the predetermined number of first signals and the predetermined number of second signals and a fourth signal representing a logical product of the predetermined number of second signals; and a latter generator generating the parity of the output data based on two or more of the third signals and two or more of the fourth signals from the two or more second component circuits of the former generator.

17. A priority encoder according to claim 16, wherein the latter generator is formed by cascade connecting a number of component circuits identical in configuration with the second component circuits of the former generator into a tree shape.

18. A priority encoder according to claim 17, wherein each of the component circuits of the latter generator generates and outputs a third signal, destined for a subsequent level component circuit, for parity generation of bit data of a particular number of the third signals based on two or more of the particular number of third signals and a particular number of the fourth signals from a particular number of previous level component circuits, and generates and outputs a logical product of the particular number of fourth signals from the particular number of previous level component circuits, as a fourth signal destined for the subsequent level component circuit.

19. A priority encoder according to claim 16, wherein the first component circuits are identical in configuration with the second component circuits.

* * * * *

UNITED STATES PATENT AND TRADEMARK OFFICE
CERTIFICATE OF CORRECTION

PATENT NO. : 8,291,307 B2
APPLICATION NO. : 12/181521
DATED : October 16, 2012
INVENTOR(S) : Moriyuki Santou It is certified that error appears in the above-identified patent and that said Letters Patent is hereby corrected as shown below:

Column 15, Line 66, in Claim 9, delete "b a" and insert -- a --, therefor.

Signed and Sealed this
Twenty-fifth Day of December, 2012

David J. Kappos
*Director of the United States Patent and Trademark Office*